United States Patent [19]

Yuan et al.

[11] 4,400,411
[45] Aug. 23, 1983

[54] TECHNIQUE OF SILICON EPITAXIAL REFILL

[75] Inventors: Han-Tzong Yuan, Dallas; Roger N. Anderson, Garland, both of Tex.

[73] Assignee: The United States of America as represented by the Secretary of the Air Force, Washington, D.C.

[21] Appl. No.: 399,568

[22] Filed: Jul. 19, 1982

[51] Int. Cl.³ .................. B05D 5/12; H01L 7/36; B44C 1/22; C03C 15/00

[52] U.S. Cl. .................. 427/86; 29/576 W; 29/580; 148/175; 156/648; 156/653; 156/657; 156/612; 156/613; 357/49; 427/94; 427/95

[58] Field of Search .............. 156/648, 653, 643, 646, 156/657, 659.1, 661.1, 662, 610, 613, 614, 612; 148/175; 427/86, 93, 94, 95; 357/47–50; 134/3; 29/576 W, 578, 580

[56] References Cited

U.S. PATENT DOCUMENTS

| | | | |
|---|---|---|---|
| 3,566,220 | 2/1971 | Post | 317/235 |
| 3,574,008 | 4/1971 | Rice | 156/648 X |
| 3,764,409 | 10/1973 | Nomura et al. | 148/175 |
| 3,780,426 | 12/1973 | Ono et al. | 29/580 |
| 4,101,350 | 7/1978 | Possley et al. | 148/175 |
| 4,141,765 | 2/1979 | Druminski et al. | 156/653 X |
| 4,151,034 | 4/1979 | Yamamoto et al. | 156/345 |
| 4,155,802 | 5/1979 | Yonezawa et al. | 156/653 |

OTHER PUBLICATIONS

Sirtl and Seiter, "Selective Epitaxy of Silicon under Quasi-Equilibrium Conditions", 1969, pp. 189–197, Semiconductor Silicon, Edited by R. R. Haberecht and E. L. Kern, Electrochem. Society Publications.

Iwamatsu, Meguro and Shimizu, "A New Isolation Structure for High Density LSI", Washington, D.C. 1973, p. 244, IEDM Technical Diggest.

Watanabe, Arita, Yokoyama and Igarashi, "Formation and Properties of Porous Silicon and its Application", 1975, p. 13.

*Primary Examiner*—William A. Powell
*Attorney, Agent, or Firm*—Donald J. Singer; Stanton E. Collier

[57] ABSTRACT

A process of forming silicon epitaxial refilled pockets in a thick oxide layer, three to five micrometers thick, on a substrate. Pockets are selectively formed in the thick oxide layer by plasma etching. The pockets are filled using a silicon tetrachloride source.

9 Claims, 6 Drawing Figures

TECHNIQUE OF SILICON EPITAXIAL REFILL

STATEMENT OF GOVERNMENT INTEREST

The invention described herein may be manufactured and used by or for the Government for governmental purposes without the payment of any royalty thereon.

BACKGROUND OF THE INVENTION

This invention relates generally to a method of producing a semiconductor device, and more particularly, to a method of electrically isolating individual devices sharing a common substrate.

In the process of fabricating integrated circuits (IC), one of the more important considerations is the means of electrically isolating devices such as amplifiers from other circuit devices placed upon a common substrate. Isolation at lower frequencies can usually block all the direct current (DC) leakage, but as the operating frequency of the integrated circuit increases, the DC parasites coupling components, mostly stray capacitance, becomes very important to the designer of integrated circuits. For example, a one picofarade stray capacitance has an impedance level equal to about 150 kiloohms at one megahertz (MHZ). At one gigahertz (GHZ), the same capacitance has an impedance of about 150 ohms; therefore, in order to fabricate high frequency integrated circuits, great effort is directed to reducing coupling capacitance and, in addition, to control the DC leakage current.

The standard junction isolation technique used in ICs at lower frequencies is not suitable at higher frequencies because the coupling capacitance does not scale proportionately to the particular device size on the IC chip. By reducing the device size so as to increase the distance between the different components, the coupling capacitance tends to remain approximately constant. In the past, most high frequency ICs have used the oxide isolation technique to minimize the above problems.

The most widely used oxide isolation technique is the nitride mask selective oxidation process known by various trade names such as SATO, ISOPLANAR, and OAT. For example, the self-aligned thick oxide (SATO) process is more limited because an excessively long oxidation time is required to grow thick oxides: a one micrometer layer of oxide requires four hours of steam oxidation at 1000° centigrade and a two micrometer layer of oxide requires 16 hours at the same temperature; therefore, clearly, oxide thicknesses ranging from three to five micrometers would not be commercially feasible using this technique.

Another technique of forming a thick oxide is the anodic oxide process. The anodization results in a porous silicon layer in which the depth and porosity are controlled by the current density and etch time. The porous layer is quickly converted to a thick oxide by a conventional wet oxygen oxidation. Oxide films can be more than an order of magnitude thicker than for the same oxidation cycle of untreated silicon. The resulting oxide does have a level surface, as in the case of epitaxial refill. The short times and relatively low temperature (1000° C.) required of this technique are especially significant for shallow junction devices such as the x-band bipolar transistors. In spite of its advantages, this technique produced layers that were critically dependent on the anodizing current density and duration. If an insufficient amount of silicon was removed, the oxide created by the excess silicon could cause the slice to bulge.

The selective epitaxial process, in the past, was demonstrated for oxide thickness in the order of one micrometer, although much thicker oxide layers are preferred for even higher frequencies up to microwave frequencies. In general, epitaxial filling of thick oxide recesses has encountered numerous problems in the past such as (1) controlling the hydrogen chloride (HCl) etch back before epitaxial deposition: the HCl tends to damage the oxide mask and also undercut the silicon around the oxide opening; (2) controlling the spurious growth of silicon spikes on the oxide surface; and (3) controlling the silicon filling rate so that the epitaxial surface levels off with the oxide surface.

The above processes and problems clearly demonstrate a need for a process that overcomes these limitations.

SUMMARY OF THE INVENTION

In order to fabricate high frequency ICs, the present invention provides solutions to the problems noted hereinabove.

To take advantage of epitaxial refill to obtain ICs capable of operating at high frequencies such as x-band, a thick oxide layer in the order of three to five micrometers is deposited on a substrate layer. Silane oxide deposition and densification produce this thick oxide layer. Because silane oxide can be deposited at a rate of 1000 A°/min and densified at low temperature this procedure circumvents the drawbacks of thermal oxidation.

To achieve a uniform precision etch into the thick oxide layer, a nitride etching mask is used. The nitride mask is etched with plasma to achieve extremely smooth edges with edge roughness no greater than 0.1 micrometers. The epitaxial refill into the pockets resulting from the etchings is accomplished using a silicon tetrachloride source.

One object of the invention is to provide a process of epitaxial refill into pockets defined by thick oxide layers.

Another object of this invention is to provide a process of forming a device that minimizes parasitic capacitance between devices upon an IC;

A further object of this invention is to provide a process of epitaxial refill of a thick oxide wherein the resulting surface is substantially flat; and A still further object of this invention is to provide a process of etching thick oxide layers for epitaxial refill purposes.

These and many other objects and advantages of the present invention will be readily apparent to one skilled in the art of semiconductor fabrication from a perusal of the claims and of the following detailed description of the preferred embodiment of the invention when considered in the light of the drawings.

DETAILED DESCRIPTION OF THE PREFERRED EMBODIMENT

Figure 1:
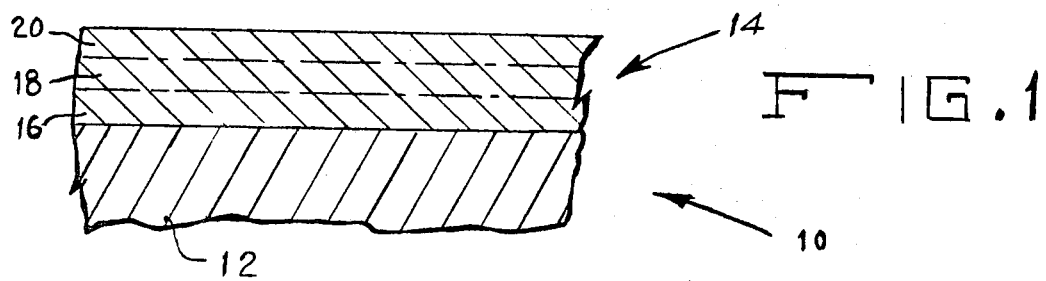
FIGS. 1-5 are sectional views of a semiconductor wafer showing the pocket formation stages of the process of this invention.

Referring to FIG. 1, a portion 10 of a semiconductor wafer includes a substrate layer 12, doped or undoped, an oxide layer 14, doped or undoped, formed on substrate layer 12. Oxide layer 14 includes a plurality of intermediate oxide layers such as 16, 18, and 20 formed on substrate 12 to a predetermined depth.

The process of epitaxial refill involves the use of a continuous flow reactor. Epitaxial deposition in this reactor differs from conventional epitaxial reactor in that the substrate can be transported into and out of the epitaxial deposition zone as well as HCL etch zone continuously and in a controlled manner. The start and stop of pre-epitaxial etching and epitaxial deposition thus can be controlled precisely by the movement of the substrate. The precision control of the etching and deposition process is one of the most important factors for successful epitaxial refill.

Preparation of substrate 12 to take advantage of epitaxial refill requires that a thick oxide layer 14 on the order of three to five micrometers be deposited upon substrate 12. Further, a process to etch such a thick oxide layer 14 to have smoothly defined edges is required.

An attempt to grow such a thick oxide layer 14 with the standard steam oxidation process yielded an unusable product. First, the thick oxide layer 14 requires hundreds of hours to grow. Second, the steam oxidation tends to invert the substrate surface, particularly high resistivity P type substrates used for high frequency IC.

The preferred process of depositing a thick oxide layer uses a series of silane oxide deposition and densification, applied alternatively to produce high quality thick oxide layers. Since both silane oxide deposition and densification are low temperature processes, these do not have the drawbacks mentioned above.

The preferred etching process of the thick oxide layer 14 employs a nitride etching mask process. It was found that a preferred thickness of 1000 A nitride mask could precisely etch a five micrometer thick oxide layer 14. Further, the nitride mask can be etched by plasma resulting in an extremely smooth edge with edge roughness no greater than 0.1 micrometer.

EXAMPLE

The following illustrative example shows the steps necessary for epitaxial refill of pockets in thick oxide layers. A silicon wafer substrate 12 is doped with boron in this example. The particular dopants are determined by the type of semiconductor device such as a substrate isolated npn power transistor 30, shown in FIG. 6. Substrate 12 has, in this example, a resistivity of 0.12 ohms-meter, an orientation of five degrees off of the (111) axis, a diameter of one and one half inches, a thickness of 10 mils, and one side polished in a conventional manner. The preparation of thick oxide layer 14 on substrate 12 is hereinafter noted.

As shown in FIG. 1 of the drawings, silicon wafer substrate 12 is treated initially with a standard oxide cleaning solution such as PWNW (piranha, distilled water, hot nitric acid, and then distilled water). Substrate 12 is then immersed in a 10% concentration of hydrogen fluoride (HF) for one minute and then rinsed in distilled water for 30 minutes. A one micrometer layer 16 of silicon oxide is deposited using the silane oxide deposition process. Layer 16 is densified by the steam process wherein substrate 12 is heated to 1000 degrees centigrade for five minutes; steam is applied to substrate 12 and layer 16 for ten minutes, and then dried for five minutes. Another one micrometer layer 18 of silane oxide is applied followed by steam densification. This process is repeated again to result in a three micrometer thickness of silicon oxide composed of three layers 16, 18, and 20. This process can be continued to increased thicknesses of silicon oxide.

Figure 2:
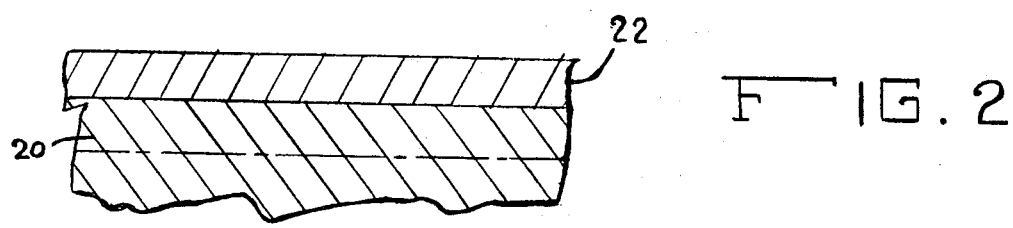
Figure 3:
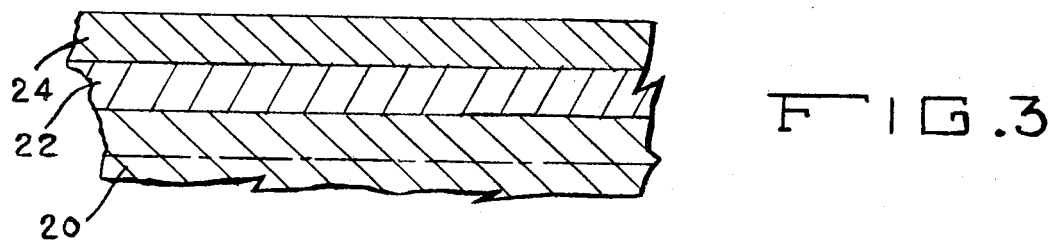

A silicon nitride ($Si_3N_4$) layer 22, FIG. 2, of about 1000 A thickness is deposited at about 900° C. over oxide layer 20. The silicon nitride layer 22 is formed by chemical vapor deposition utilizing the reaction between silane and ammonia. A photoresist layer 24, FIG. 3, is applied over silicon nitride layer 22 so as to define selective areas to be etched using, for example, a plasma.

Figure 4:
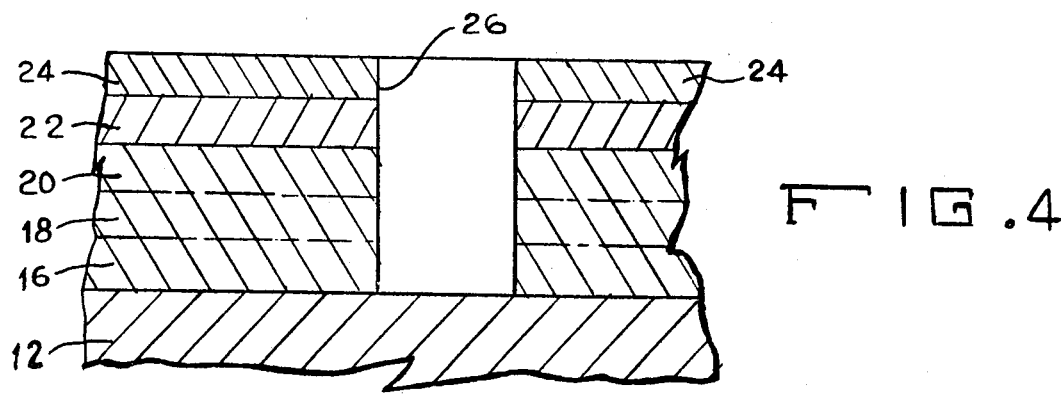

After the plasma etching, FIG. 4, an asher removes the remaining photoresist. At this point in the process, a plurality of pockets 26 (only one of which is shown in the drawings) are formed in the nitride layer and oxide layer to a predetermined depth. A common oxide etchant such as a buffered solution of HF is applied for about 30 minutes. The remaining nitride is removed by phosphoric acid solution at 150° C. Substrate 12 and layer 14 is then treated with the standard oxide cleaning solution after which a 10% contration of HF is applied for 10 seconds. This combination is finally rinsed in distilled water for 30 minutes. Substrate 12 with oxide layer 14 having a plurality of pockets 26 is then ready for epitaxial refill of the pockets.

The first attempt at epitaxial refill used a silicon dichlorine source at a temperature of 1130° C. This source resulted in unwanted polysilicon growths on top of oxide layer 20. Next, a silicon tetrachloride ($SiCl_4$) source was used. A 3% and 5% concentration of $SiCl_4$ resulted in no unwanted growths. The total growth time in both cases is 160 seconds at a temperature of 1130° C.

Figure 5:
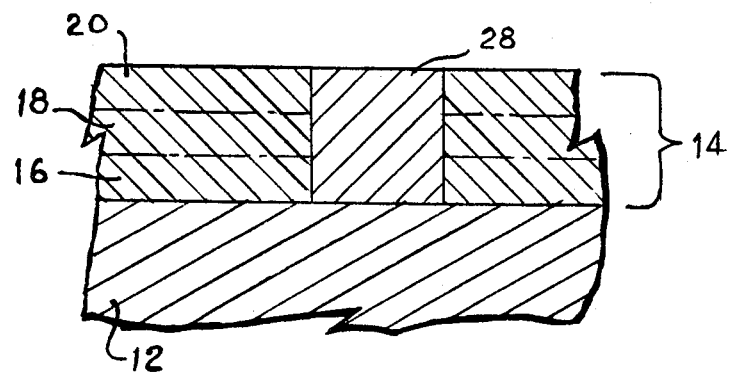

Examination by a scanning electron microscope revealed that the epitaxial refill 28, FIG. 5, replicated the oxide edge roughness. Further, the epitaxial refill rate was determined to be 0.5 micrometers per minute for the 5% silicon tetrachloride.

To determine the degree of DC isolation one epitaxial refill was doped heavily with phosphorous to form an N+type refill. Since the substrate was doped with boron, refilled regions are isolated from substrate by pn junctions. The leakage current between two isolated adjacent refills was less than 10 microampers. The breakdown voltage of the pn junction was measured to be typically greater than 30 volts. Thus, it is clearly seen that this structure offers adequate isolation, and the thick oxide will improve high frequency performance.

Figure 6:
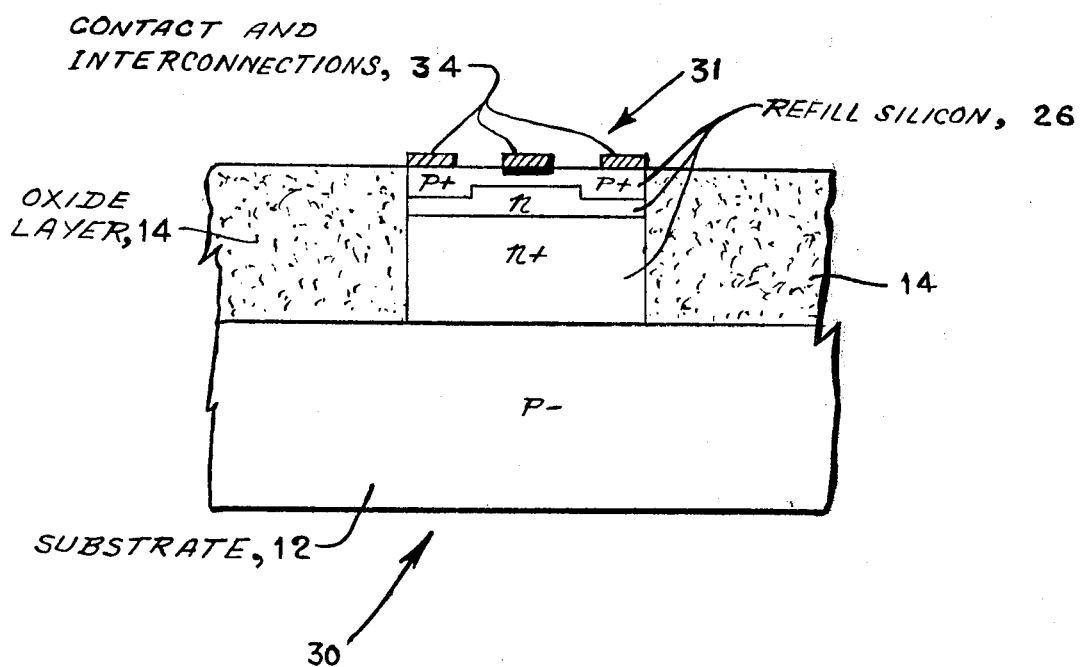
FIG. 6 is a pictorial view of a portion of a semiconductor transistor using the device formed by the process of this invention.

Referring to FIG. 6, the pictorial shows a pocket of refilled silicon 26 in oxide layer 14 and on p- substrate 12 made into substrate isolated npn power transistor 30, appropriately doped. Thick oxide layer 14 is shown to surround the transistor 31. A plurality of these transistors can be placed upon a common substrate and are connected by means of metal strips 34 to form an amplifier.

Obviously, many modifications and variations of the present invention are possible in light of the above teachings and it is therefore understood that, within the scope of the disclosed inventive concept, the invention may be practiced other than specifically disclosed.

What is claimed is:

1. A process of forming a plurality of epitaxial refills in thick oxide layers using a continuous flow reactor for use in producing semiconductor devices, comprising the sequential steps of:

forming a silicon substrate for supporting said epitaxial refills;

treating said substrate with a first standard silicon cleaning solution;

immersing said treated substrate in a first acid;

rinsing said acid from said substrate with distilled water;

forming an oxide layer on said substrate, said oxide layer comprising densified silane oxide layers;

forming a silicon nitride layer on said plurality of densified silane oxide layers;

selectively forming a photoresist layer on said silicon nitride layer;

etching to a predetermined depth selective areas of said photoresist layer, said silicon nitride layer, and said silane oxide layers;

removing the remaining photoresist with an asher;

applying a common oxide echant to the exposed silane oxide layer;

removing the remaining silicon nitride;

treating said etched oxide layer with a second standard silicon cleaning solution;

immersing said treated etched oxide and substrate in a second acid;

rinsing said second acid from said etched oxide layer and substrate with distilled water; and filling pockets formed by etching in said silane oxide layers with said refill, said refill being substantially level to the surface of said silane oxide layers.

2. A process as defined in claim 1, wherein a (111) silicon wafer substrate is used.

3. A process as defined in claim 1, wherein said first and second standard silicon cleaning solution comprises piranha, water, nitric acid, and water, applied in sequence.

4. A process as defined in claim 3, wherein said first and second acids are 10% hydrogen fluoride, said first acid applied for about one minute and said second acid for about 10 seconds.

5. A process as defined in claim 1, wherein said forming of said oxide layer uses a silane oxide deposition process, said densifying uses a steam process and said densified silane oxide layers result in a thickness ranging from three to five micrometers.

6. A process as defined in claim 5, wherein said forming a silicon nitride layer uses a vapor deposition process between reacting monosilane and ammonia at about 900° C. to form a layer about 1000 A thick.

7. A process as defined in claim 6, wherein said etching uses a plasma process so that edges formed in said thick oxide layer are substantially straight and uniform.

8. A process as defined in claim 7, wherein removing the remaining silicon nitride employs a phosphoric acid solution at about 150° C.

9. A process as defined in claim 1, wherein said filling step uses a silicon tetrachloride source having a concentration from about 3% to about 5% with a growth time of about 160 seconds at a temperature of about 1130° C.

* * * * *